United States Patent [19]

Hatanaka et al.

[11] Patent Number: 5,962,083
[45] Date of Patent: *Oct. 5, 1999

[54] METHODS OF DEPOSITING FILMS ON POLYMER SUBSTRATES

[75] Inventors: Yoshinori Hatanaka; Yoichiro Nakanishi; Sunil Wickramanayaka; Keiichiro Sano; Masaya Nomura, all of Hamamatsu; Shigekazu Hayashi, Yokohama, all of Japan

[73] Assignee: Suzuki Motor Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/664,959

[22] Filed: Jun. 13, 1996

[51] Int. Cl.$^6$ ........................................................ H05H 1/18
[52] U.S. Cl. ............................ 427/571; 427/574; 427/579
[58] Field of Search ..................................... 427/574, 575, 427/576, 579, 571

[56] References Cited

U.S. PATENT DOCUMENTS 4,835,005   5/1989   Hirooka et al. ........................... 427/578

OTHER PUBLICATIONS

Suzuki Technical Review vol. 21 published on Jan. 31, 1995, pp. 49 to 55, "Deposition of SiO$_2$ Films on Polymer Substrate Using ECR Plasma and Analysis of Film Quality."

Preprints of the lectures No. 956 published by Jidosha–Gitjutsukai on Sep. 1, 1995, pp. 41 to 44, "Low temperature deposition of SiO$_2$ thin films on plastics as a hard coating using TEOS/O$_2$–plasma." The lectures were given in Beppu, Japan during Sep. 26 to 28, 1995.

Sen–i Gakkai Preprints (1995(F)) published by Sen–i Gakkai (The Society of Fiber Science and Technology, Japan) on Oct. 23, 1995, p. F–83, "Low temperature Deposition of SiO$_2$ films on polymer surfaces by TEOS/O$_2$ECR plasma(1)."

The 1995 Fall Meeting of the Materials Research Society was held in Boston, Massachusetts at the end of Nov., 1995.

A booklet with the title "*the fourth meeting to present advanced technologies in companies*" published by Shizuoka Kagaku–kogaku konwa–kai on Jan. 31, 1996, pp. 25 to 30 "Low temperature Deposition of SiO$_2$ films on polymer surfaces by TEO/O$_2$–ECR plasma." The lectures were given at the faculty of engineering, Shizuoka University in Japan on Jan. 3, 1996.

Extended Abstracts (The 43rd Spring Meeting, 1996) published by the Japan Society of Applied Physics and Related Societies on Mar. 26, 1996, p. 844, "Low temperature Deposition of SiO$_2$ Using TEOS in ECR plasma (3)." The lectures were given at Tokyo University in Asaka–city, Japan on Mar. 26 to 29, 1996.

K. Sano et al.; Deposition of High Quality SiO$_2$ Films Using Teos by ECR Plasma, Mat. Res. Soc. Symp. Proc. 396:539–543 (1996).

*Primary Examiner*—Shrive Beck
*Assistant Examiner*—Bret Chen
*Attorney, Agent, or Firm*—Alston & Bird LLP

[57] ABSTRACT

A method of depositing a thin film on a polymer substrate by plasma CVD comprises applying a magnetic field to a plasma generating chamber by activating a magnetic coil placed in the circumference of the plasma generating chamber, the plasma generating chamber having an inlet; introducing a microwave into the plasma generating chamber; introducing an upstream gas into the plasma generating chamber wherein an ECR plasma is generated; vaporizing a feed gas wherein a supply gas is generated and carries the ECR plasma; passing said ECR plasma through a mesh provided between the inlet and a polymer substrate located downstream of the inlet; and depositing a film on the surface of the polymer substrate.

8 Claims, 12 Drawing Sheets

×500

×500

×500

×500

×500

×500

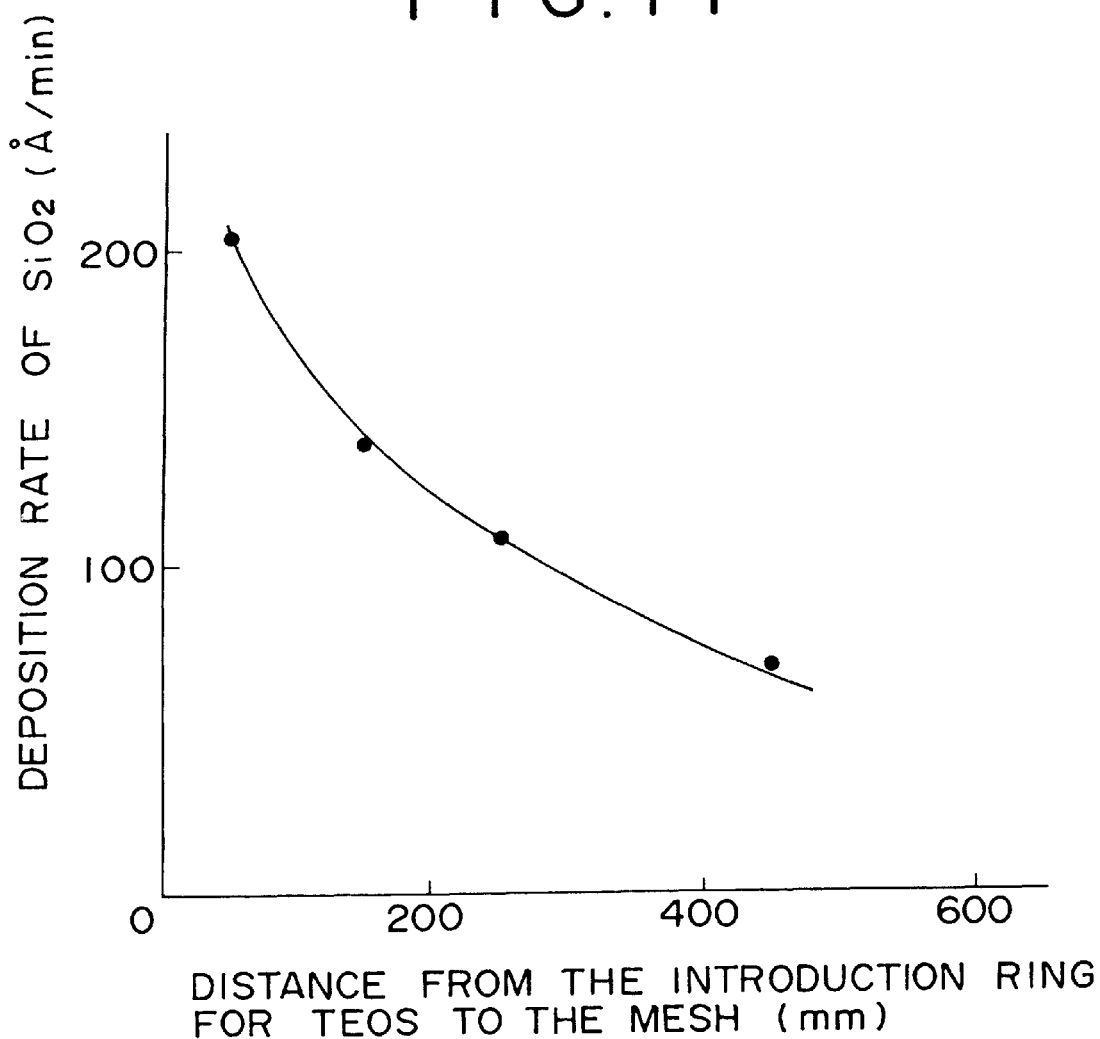
F I G. 14

METHODS OF DEPOSITING FILMS ON POLYMER SUBSTRATES

BACKGROUND OF THE INVENTION

The present invention relates to a method of depositing a thin film on a polymer substrate by plasma Chemical Vapor Deposition.

Recently, environmental-conscious automobiles having a high performance is increasingly desired and most of the automobile components have been converted into those made from plastics, resulting in automobiles of lighter body weights which enable more efficient gas mileage. Especially, thermoplastic materials are considered to be attractive materials which can be recycled easily and tried to be utilized increasingly in automobile components. However, plastic materials are less excellent with regard to mechanical strength, surface hardness and friction resistance when compared with metallic materials. In addition, the surface undergoes decoloration and reduction in strength due to solar ultraviolet and heat, exhibiting poor weatherability. When taking performance and quality of automobiles into account, the application of plastics to the components are limited. Unless the function is enhanced by means of some kind of surface treatment of the plastics, no advance in introducing the plastic into the automobile components is expected.

An example of the surface treatment of the plastics as mentioned above is thin film deposition by plasma CVD. When using the plasma CVD, the temperature of the substrate is heated to 400° C. or higher to remove the impurities contained in $SiO_2$ film, resulting in an excellent coating of $SiO_2$ film. However, a plastic material having a low heat resistance could not be coated (Sunil Wickramanayaka, Yoshinori Hatanaka, Society of Electronics Communication, Technical report, Vol.93, p.91–86, 1993). Accordingly, within the same plasma device, a polymer substrate is first plasma-treated with non-polymerizable gas such as CO, $H_2$ and $O_2$ to enhance the ability of binding with a film, and then the plasma polymerization of an organic silane compound is conducted in an attempt to form a plasma polymerization film having an excellent durability. However, the thin film thus obtained can be bound satisfactorily to the substrate but contains a large amount of impurities such as carbon and moisture, resulting in insufficient hardness and poor friction resistance (Publication of Laid-open Japanese Patent Application, S62-132940).

On the other hand, a reaction gas is introduced into a vacuum chamber, to which a magnetic field of 875 gauss is applied while applying microwave to obtain electron cyclotron resonance effect, which allows the microwave electric field to accelerate the electrons in the plasma, resulting in a high density plasma, utilizing a developed Electron Cyclotron Resonance plasma device.

SUMMARY OF THE INVENTION

However, any of the methods of the prior art mentioned above suffers from high running costs due to the use of a large amount of a supply gas and extensive staining of the device, resulting in complicated and expensive maintenance. In addition, since a prolonged period is required for film deposition, the plastic substrate is subjected to a heat loading which is still high and thus the substrate is highly damaged, resulting in the problems of residual strain and cracks in the film.

Accordingly, an objective of the present invention is to provide a thin film deposition method by plasma CVD onto a polymer substrate and a device therefor, which utilize ECR plasma CVD (Electron Cyclotron Resonance Plasma Assisted Chemical Vapor Deposition) capable of a low temperature deposition of a high quality film and by which a transparent $SiO_2$ thin film is deposited on the surface of a plastic material, whereby achieving an improved surface hardness without affecting the appearance. According to the present invention, the surface performance of the plastic material is improved dramatically, and the components which have been impossible to be made from plastic materials can be made from plastic materials on the practical basis, whereby achieving recyclable and lighter weight automobile components.

For the purpose of achieving the objective mentioned above, one aspect of the present invention resides in a method of depositing a thin film on a polymer substrate by plasma CVD wherein a magnetic field is applied to a plasma generating chamber by a magnetic coil placed in a circumference of the plasma generating chamber, a microwave is introduced into the plasma generating chamber, an upstream gas is introduced into the plasma generating chamber whereby generating an ECR plasma, a feed gas is vaporized to the downstream whereby generating a supply gas, the supply gas is supplied via an inlet, the ECR plasma is passed through a mesh provided between the inlet and a polymer substrate or between the plasma generating chamber and the inlet, whereby depositing a $SiO_2$ film on the surface of the polymer substrate.

Another aspect in accordance with the present invention resides in a device for depositing a thin film on a polymer substrate by plasma CVD comprising a plasma generating chamber to which a magnetic field is applied by a magnetic coil placed in its circumference and into which a microwave is introduced and into which an upstream gas is introduced whereby generating an ECR plasma, an inlet through which a supply gas is supplied to the downstream and a mesh which is provided between the inlet and a polymer substrate or between the plasma generating chamber and the inlet and through which the ECR plasma is passed.

BRIEF DESCRIPTION OF THE DRAWINGS

FIG. 14 shows the graph indicating the relationship between the position of the mesh and the film deposition rate.

PREFERRED EMBODIMENTS OF THE INVENTION

Figure 1:
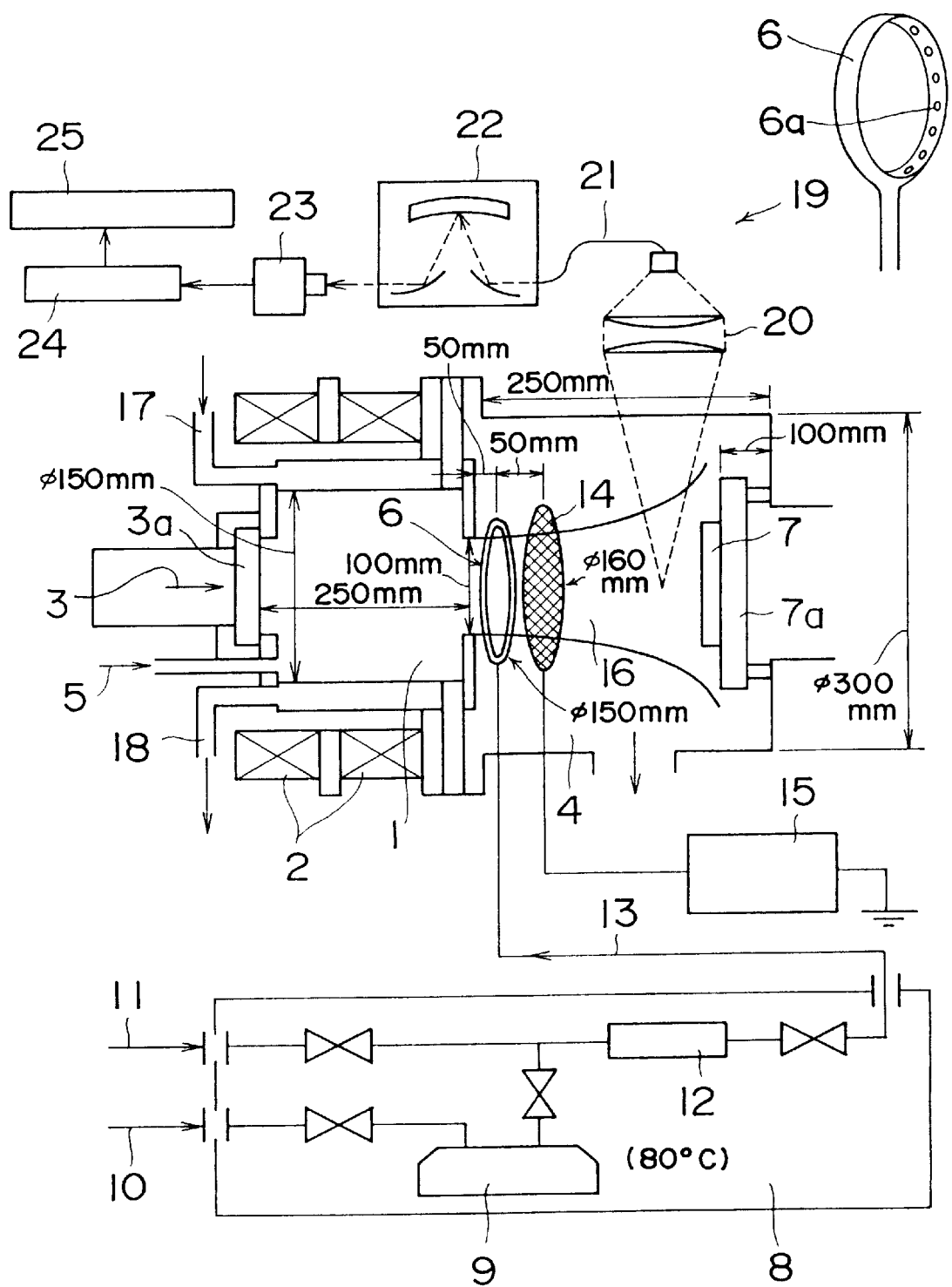
FIG. 1 shows the schematic view of one embodiment of the ECR plasma CVD device according to the present invention.

FIG. 1 shows an embodiment of a device used in a method of depositing a thin film on a polymer substrate by plasma CVD according to the present invention.

The device is an ECR plasma CVD device of a lateral type structure, in which magnetic coil 2 is provided in the circumference of plasma generating chamber 1, to which a magnetic field as an ECR condition is applied and to which a microwave is introduced as shown by 3, whereby generating a plasma. Quartz glass 3a is also provided. The distribution of the magnetic field of magnetic coil 2 is of a divergent magnetic field type lowering in the direction from plasma generation chamber 1 to sample chamber 4. An upstream gas is introduced denoted by 5 into plasma generating chamber while controlling the flow rate by a mass flow controller to generate an ECR plasma.

At its downstream, a feed fluid is warmed to vaporize into a gas, which is introduced through inlet 6 in a form of a ring while controlling the flow rate, whereby depositing $SiO_2$ film onto the surface of polymer substrate 7 (plastic substrate) such as those made from PC (polycarbonate resin) or PP (polypropylene). Supply system 8 of the feed gas consists of material gas tank 9, feed gas supply line 10, purge gas supply line 11 and Magnesium Flat Cell device 12. In device 12, the feed gas from gas supply line 10 is stored temporarily in feed gas tank 9, and then mixed in MFC device 12 with the purge gas (such as $N_2$) from purge gas supply line 11, and a predetermined amount of the mixture is supplied into inlet 6 via supply line 13. Inlet 6 is provided with a plurality of small holes 6a on the internal surface of the ring tube, and the gas flows uniformly out of these small holes 6a (See FIG. 1).

As mentioned above, the materials of plastic substrate 7 to which the invention is applied include polymers such as polycarbonate (PC), polypropylene (PP), polyethylene (PE) and polystyrene (PS).

The feed gases to be vapor-deposited include Si-containing compounds such as monosilane, tetramethylsilane, hexamethylsidisilane and tetraethoxysilane.

The gases supplied to the upstream include $O_2$, CO, $H_2$, He, Ar, etc.

The device is further provided with circular mesh 14 which is earthed and placed between feed gas inlet 6 and substrate 7. Mesh 14 is usually made from a metal and it is earthed or alternatively a direct current positive and negative voltage is applied. The component designated by 15 is a direct current power supply. Since mesh 14 captures electrons in the plasma and allows them to escape into the earth, only the radicals (neutrons) in the plasma are passed through exclusively. Accordingly, the diameter of the mesh, the sectional area of the wire and the lattice interstice size are essential.

Mesh 14 should have a diameter greater than that of supply gas inlet 6 in a form of a ring and that of plasma stream 16 generated at this point.

For example, in the case where mesh 14 is made from a stainless steel wire, if the sectional area of the wire is too large, then the wire pattern is transferred onto the surface of the film formed, and the surface becomes irregular. Thus the wire should be fine to some extent. Typically, the diameter of the wire is preferably $\phi$0.1 mm to 1 mm.

The lattice interstice size of mesh 14 should be small to some extent since too coarse lattice can not trap the electrons in the plasma and allows them to pass through mesh 14 together with the radicals. Typically, the lattice interstice size is preferably 5 mm×5 mm. The lattice pattern is not particularly limited, and octangular pattern may be employed for example, although the area of one interstice of the lattice is preferably 25 $mm^2$ or less.

The relationship between the positions of mesh 14, supply gas inlet 6 in the form of a ring and substrate 7 (regardless of the materials such as plastics, metals, ceramics etc.) is essential for the low temperature high rate deposition of $SiO_2$ film.

The position of mesh 14 should not be close to the substrate apart from supply gas inlet 6 in the form of a ring but preferably be closer to supply gas inlet 6 in the form of a ring in order to obtain a higher rate of $SiO_2$ film deposition. Alternatively, for the same effects, mesh 14 can be placed in plasma generating chamber 1 or between plasma generating chamber 1 and supply gas inlet 6 in the form of a ring.

By means of earthing mesh 14 or applying direct current voltage from negative to positive, the amounts of electrons, negative ions and positive ions in the plasma can be controlled. When the direct current voltage within the range from −50V to +50V is applied, the film deposition rate is increased. Especially, in the case of 0 V, i.e., in the case of mesh 14 being only earthed without applying the voltage, the electrons in the plasma can be trapped most effectively, and the film deposition rate is markedly increased (see examples described below). In order to increase the rate of $SiO_2$ film deposition, it is preferable to earth the mesh 14.

When a direct current voltage is applied to mesh 14, mesh 14 should be insulated completely from the reaction chamber.

For the purpose of obtaining an excellent $SiO_2$ coating containing no impurities without heating the substrate, the plasma generating conditions should be controlled precisely. Particularly, the amount of the supply gas as the coating material is important. For example, in the case where TEOS (tetraethoxysilane) gas is employed as the supply gas, an excessive supply such as 2 sccm (abbreviation of standard cc/min, corresponding to cc/min in SI unit system (at 25° C.) results in a markedly low film deposition rate within the microwave range of 100 to 200 W (see description for FIG. 2 in the following examples). TEOS gas at the rate of 2 sccm results in a marked increase in the content of carbon which is an impurity in the film, leading to poor quality of the film (see description for FIG. 4 in the following examples). Accordingly, at the oxygen gas supply of 10 sccm, a $SiO_2$ film of satisfactory quality can be coated by restricting TEOS gas supply to 1.5 sccm or less. More preferably, TEOS supply rate is 1.5 sccm for the highest film deposition rate. Moreover, in these plasma conditions, it is effective to place earthed mesh 14 at the position of 50 mm from supply gas inlet 6 in the form of a ring, since the film deposition rate is increased remarkably (see description for FIGS. 2 and 7 in the following examples). Also when a mesh is employed, the quality of the film is not reduced (see description for FIG. 4 in the following examples).

In the device shown in FIG. 1, a cooling water is supplied from cooling water supply opening 17 and drained through cooling water exhaust opening 18. Heating device 7a is also provided to heat substrate 7.

The device shown in FIG. 1 is also provided with measurement device 19. In measurement device 19, the deposition on the substrate 7 is monitored by quartz lens 20, and transferred via optical fiber 21 to spectrometer 22. Form spectrometer 22, the data are further transferred via detector 23 and controller 24 to microprocessor 25, where the data are analyzed to correct the control condition.

WORKING EXAMPLES

Using the ECR plasma CVD device shown in FIG. 1, a film deposition experiment was conducted. The conditions and the results of the experiment are described below.

Plastic test pieces

Transparent PC material and impact-resistant PP material which are commonly employed in automobiles were selected as the material for test pieces. The test pieces were made by injection molding to form the plastic plates (60× 60×3 mm).

Feed gas

Although monosilane ($SiH_4$) is employed frequently to deposit $SiO_2$ film of a high quality, it is a highly flammable and extremely hazardous gas. Therefore, safer TEOS $Si(OC_2H_5)_4$ was employed as the supply gas.

$SiO_2$ film deposition method

In this experiment, in a ECR plasma CVD device of a lateral structure, a magnetic coil was provided in the circumference of the plasma generating chamber, and the magnetic field of the magnetic flux density of 875 Gauss, which is an ECR requirement, was applied, and a microwave was introduced into the generating chamber, whereby generating the plasma. The distribution of the magnetic field of the magnetic coil was of a divergent magnetic field type lowering in the direction from the plasma generation chamber to the sample chamber. Highly pure $O_2$ gas as the upstream gas was introduced into the plasma generating chamber while controlling the flow rate by a mass flow controller, whereby generating the ECR plasma. At its downstream, a highly pure liquid TEOS was warmed at 80° C. to vaporize into a gas, which was introduced through inlet 6 in a form of a ring of the diameter of 150 mm while controlling the flow rate, whereby depositing $SiO_2$ film of the thickness of 1.0 $\mu$m onto the surface of PC and PP. The diameter of small holes 6a in inlet 6 is 2 mm and 16 holes in total were provided. In order to evaluate the film characteristics in detail, the film was deposited also onto the surface of a single crystal silicon (Si<100>). In addition, the film was also deposited while placing an earthed circular (160 mm in diameter) mesh (stainless steel wire of 0.2 mm in diameter, lattice interstice size of 1.5×1.75 mm) between the TEOS inlet and the substrate. The mesh was placed 50 mm downstream of the TEOS inlet. When the plasma is passed through the mesh, the charged electrons in the plasma are allowed to escape into the earth, whereby reducing the electrons. First, a preliminary experiment was conducted to investigate the basic characteristics of the ECR plasma CVD. Based on the characteristics thus understood, the plasma CVD conditions suitable for $SiO_2$ film deposition onto the plastic surface were established and then the experiments of the deposition of the film onto PC and PP surfaces were conducted.

Analysis of plasma emission species

In order to analyze the plasma characteristics during the film deposition, plasma emission spectophotometry was performed to determine the emission species of ions, atoms and molecules generated in the plasma. The plasma emission spectrophotometry was performed using a spectrophotometer manufactured by SOFILE Instruments. The emission spectrum at the center of the downstream plasma near the substrate was determined via two quartz convex lenses.

$SiO_2$ film evaluation method

The thickness of the film after deposition was determined by measuring the film deposited on the Si substrate using an ellipsometer and the film was evaluated by means of FTIR (Fourier Transform Infrared Spectroscopy) and XPS (X-ray Photoelectron Spectroscopy). The deposited film was observed by SEM (Scanning Electron Microscope) and AFM (Atomic Force Microscope). Since the difference in the hardness at the surface layer of the substrate onto which the $SiO_2$ film was deposited was difficult to detect by the determination of Rockwell hardness or Vickers Hardness, a dynamic superfine hardness meter was employed. In this procedure, a diamond pressure probe (a cone having the slope angle of 115 degrees) was inserted into the film at a constant speed vertically against the surface, and the load in the direction of the depth was read and the hardness was calculated. The dynamic hardness is calculated by the equation shown below:

$$DH = a \times P/D^2$$

wherein a represents a constant based on the shape of the pressure probe (=37.838), P represents the test load, and D represents the depth to which the probe is inserted ($\mu$m). To the deposited film of 1.0 $\mu$m, the depth to which the probe was inserted was 0.8 $\mu$m from the surface of the film.

Results:

Feed supply and deposition rate

Figure 2:
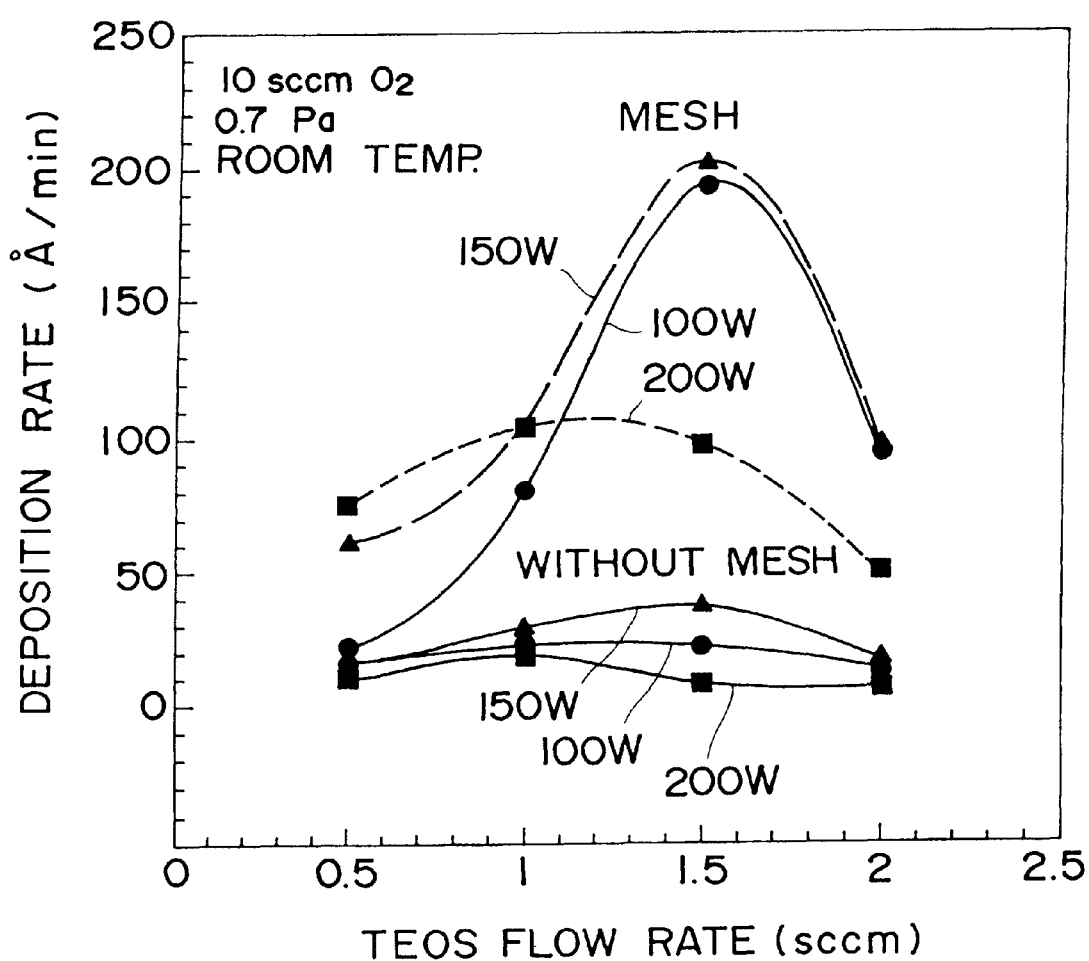
FIG. 2 shows the graph indicating the film deposition rate vs the TEOS supply.
Figure 3:
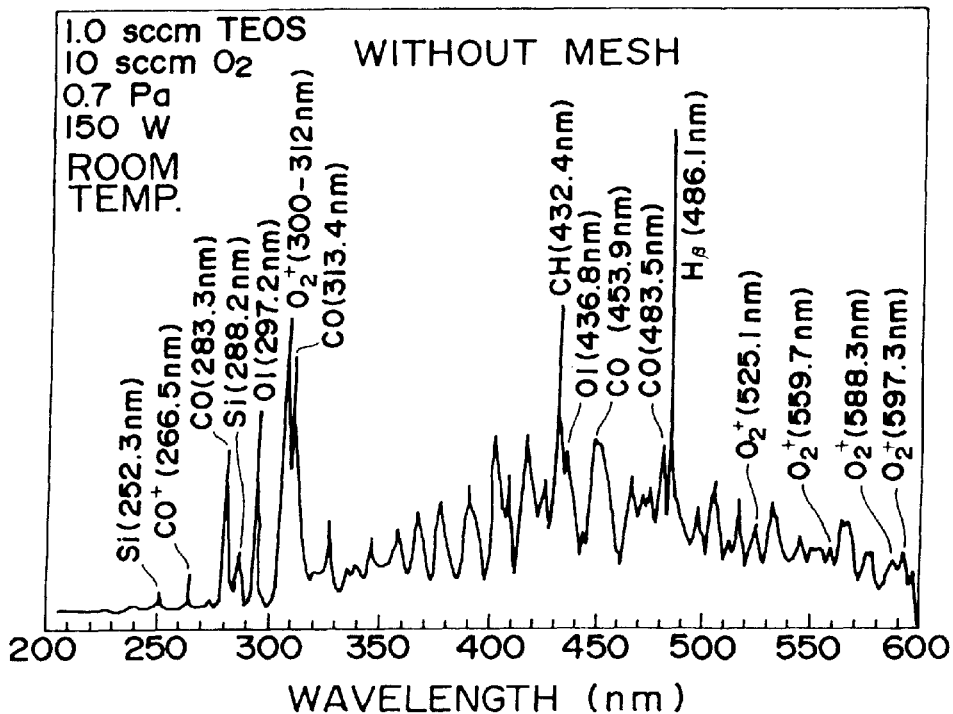
FIG. 3 shows the graphs of the wavelength vs relative intensity with and without the mesh.
Figure 3:
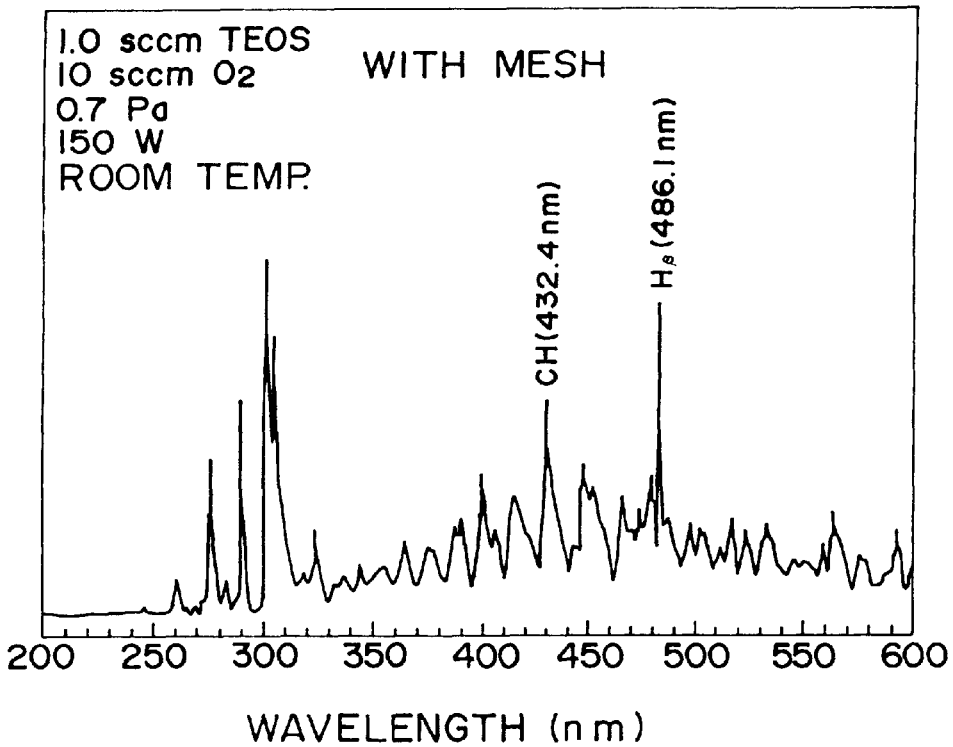

FIG. 2 shows the relationship between the TEOS supply and the deposition rate with and without the mesh. The incident power was varied stepwise from 100 W, 150 W to 200 W. When the mesh was used, the deposition rate was increased markedly when compared with the rate without the mesh. FIG. 3 shows the plasma emission spectra with and without the mesh. When the mesh was used, the intensity of hydrogen atoms generated by cleavage of alkyl groups of TEOS was reduced. Usually, $SiO_2$ film deposition reaction by the TEOS/$O_2^-$ECR plasma CVD is believed to proceed stepwise. First, in a gas phase, a precursor cleaved from a TEOS molecule by the bombardment with the oxygen radical from the upstream plasma is adsorbed to the surface of the substrate. Then, the precursor adsorbed to the surface undergoes the oxidation by the bombardment with the oxygen radical flux, resulting in a $SiO_2$ film. At the same time with the $SiO_2$ deposition reaction, the precursor adsorbed to the surface of the substrate and the deposited film are subjected to etching and release reaction. Thus, the reason why the deposition rate was increased when the mesh was used was that when the plasma from the upstream passed through the mesh the charged electron in the plasma flowed into the earth and the ion in the plasma was reduced, whereby suppressing the excessive decomposition of the TEOS molecule and $SiO_2$ film precursor by the ion in the gas phase reaction, resulting in an increased film deposition probability. Another reason is that the $SiO_2$ film deposited on the surface of the substrate became less etched by the hydrogen ion. The change in the deposition rate was relatively similar regardless of the presence of the mesh. At any incident power, the deposition rate was increased as the supply was increased to a certain limit. This is considered to be due to the presence of the $O_2$ radical in an excess amount in relation to the TEOS supply. However, when the TEOS supply exceeded a certain limit, then the deposition rate became rather lower. This behavior may be attributable to that the $O_2$ radical was insufficient in relation to the TEOS supply and that the increase in the TEOS supply caused a higher concentration of TEOS in the gas phase and an increased amount of TEOS molecule diffused, resulting in the gas phase reaction region which had been transferred in the direction of the upstream. When the incident power was increased from 100 W to 150 W, the deposition rate was increased relatively. However, when the incident power was increased to 200 W, then the deposition rate was rather lowered, and became lower than that at 100 W. The reason for this behavior is that the increase in the incident power caused an excessive decomposition of TEOS molecule and $SiO_2$ film precursor in the gas phase. Furthermore, there may be another reason that on the surface of the substrate the etching of the deposited film and the release reaction may be promoted.

Chemical analysis of $SiO_2$ film

Figure 4:
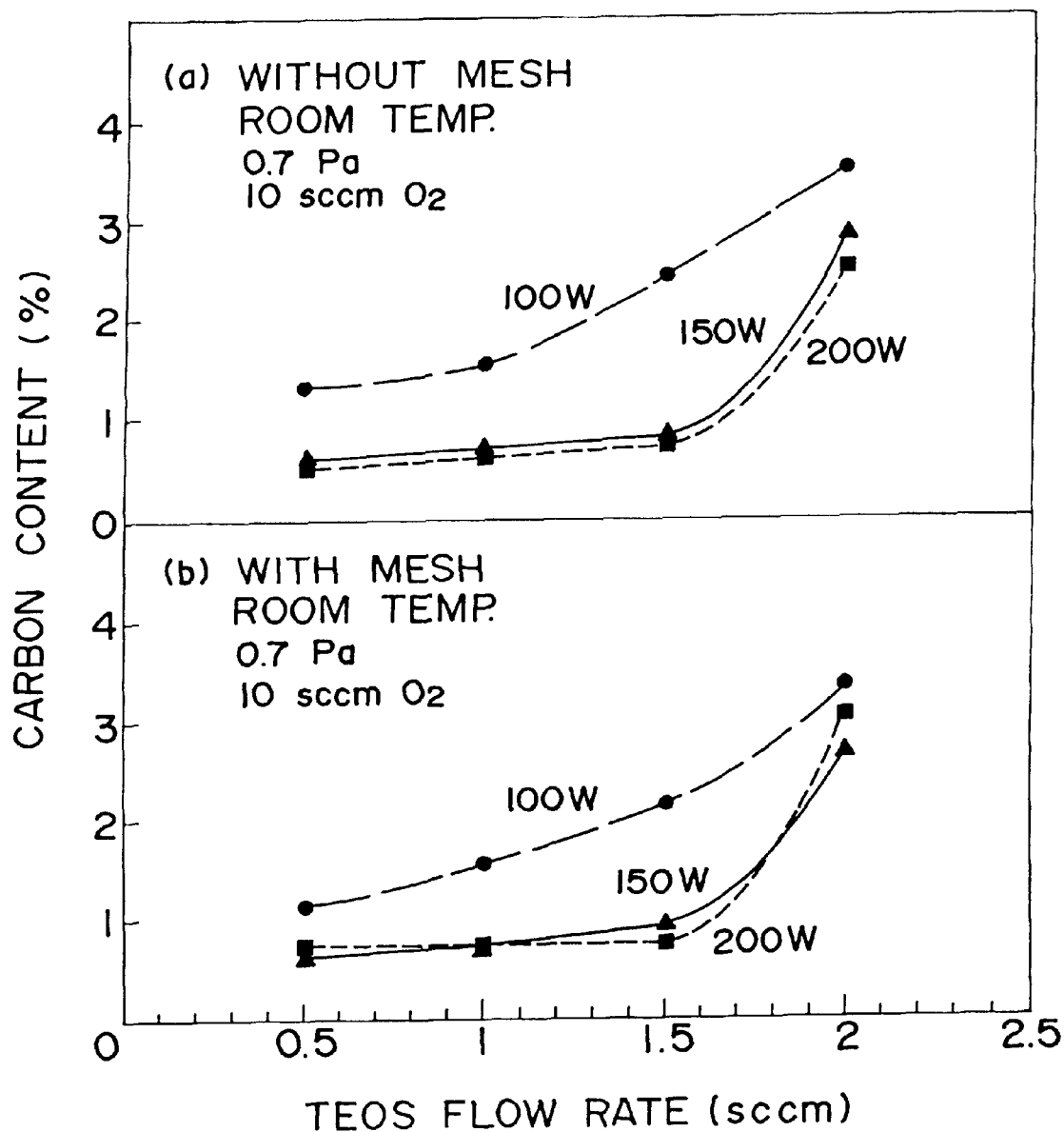
FIG. 4 shows the graphs of the carbon content of $SiO_2$ film vs TEOS supply.
Figure 5:
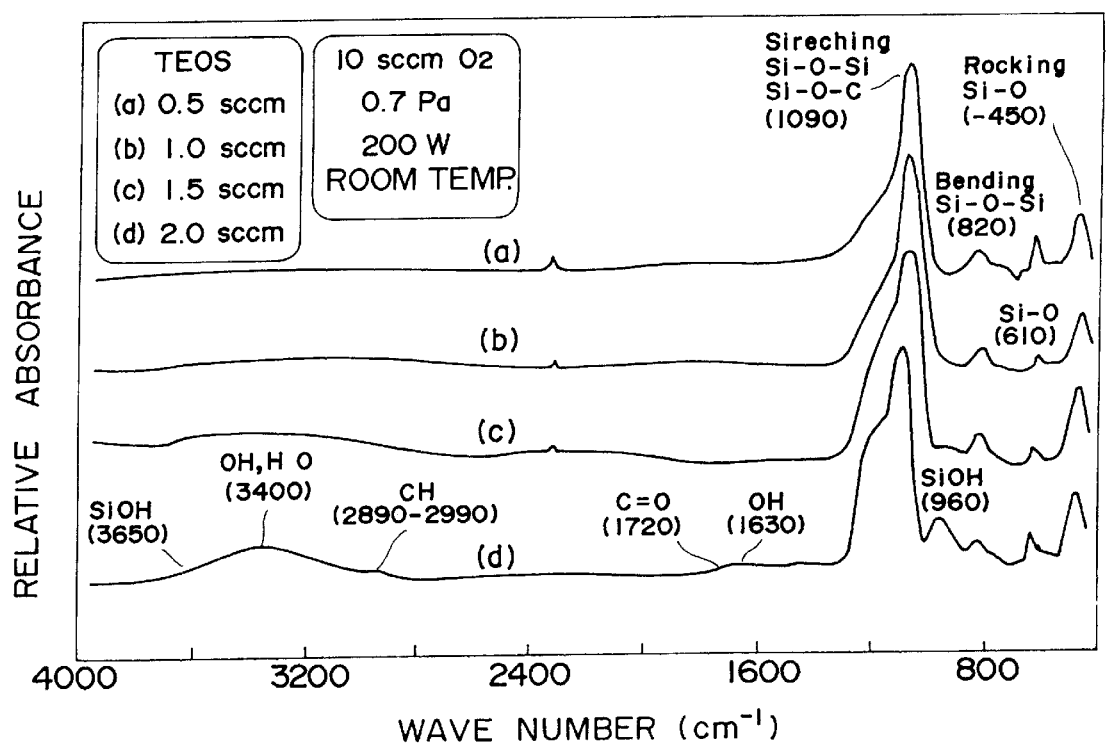
FIG. 5 shows the Farrer Transform Infrared Spectroscopy spectra of the $SiO_2$ films deposited at varying TEOS supplies.
Figure 6:
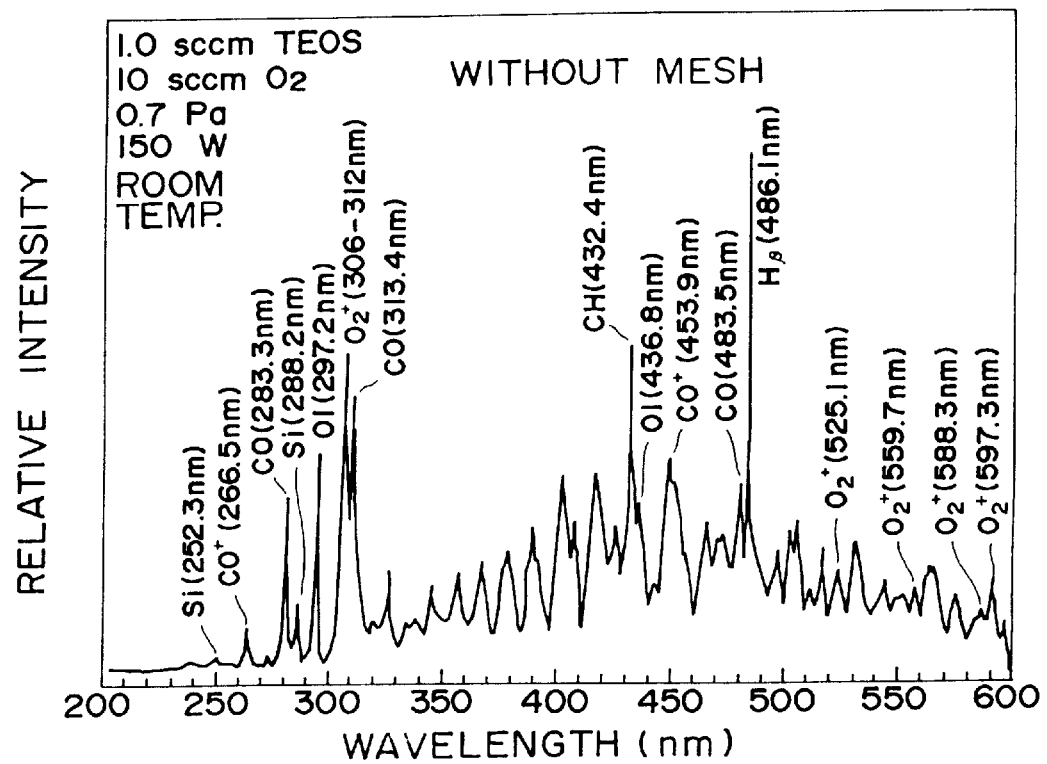
FIG. 6 shows the graphs of the plasma emission spectra at varying TEOS supplies.
Figure 6:
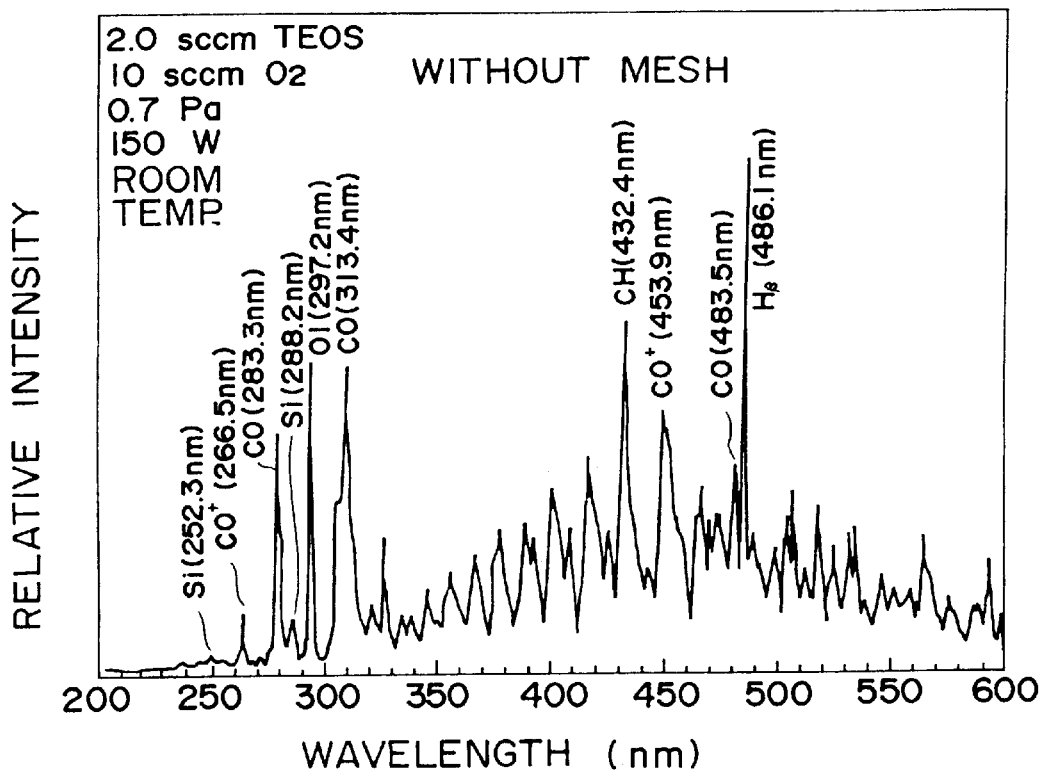

FIG. 4 shows the changes in the content of C (carbon) in the deposited film in relation to the TEOS supply with and without the mesh. The content of C was calculated based on the XPS determination. Regardless of the presence of the mesh, the content of C in the deposited film was increased as the TEOS supply was increased, exhibiting the reduction in the film quality. FIG. 5 shows a FTIR spectrum of the $SiO_2$ film deposited without the mesh while varying the TEOS supply. In any film, absorptions of Si—O (stretching vibration) at 1090 $cm^{-1}$, Si—O—Si (deformation vibration) at 820 $cm^{-1}$ and Si—O (rocking vibration) at 450 $cm^{-1}$ were observed. Especially when the TEOS supply was 0.5–1.0 sccm, there were no absorptions of Si—OH at 960 $cm^{-1}$, Si—OH at 3650 $cm^{-1}$, —OH and $H_2O$ at 3400 $cm^{-1}$ or CH at 2890–2990 $cm^{-1}$, indicating an excellent $SiO_2$ deposition. However, when the TEOS supply was increased to 0.5–1.0 sccm, those absorptions became apparent, indicating the reduction in the quality of the $SiO_2$ film. FIG. 6 shows the plasma emission spectra at the TEOS supplies of 1.0 sccm and 2.0 sccm. The spectrum at the TEOS supply of 1.0 sccm with which an excellent $SiO_2$ film could be obtained had the emission peak of $O_2^+$ near 310 nm. However, when TEOS supply became as excessive as 2.0 sccm, this $O_2^+$ peak disappeared. This behavior suggests that in response to the excessive TEOS supply an excessive amount of $O_2$ was consumed and the $O_2$ radical required for the $SiO_2$ formation reaction became insufficient, resulting in incomplete reaction, which caused the alkyl groups, reaction intermediates and byproducts such as $H_2O$ and Si—OH to be eliminated incompletely from TEOS and allowed them to remain in the film, resulting in unsuccessful formation of a high quality film.

The results mentioned above suggest that by means of a proper control of the TEOS supply a $SiO_2$ film of a high quality which contains no OH, $H_2O$ or alkyl group can be deposited without raising the temperature of the substrate. Accordingly, the ECR plasma CVD is considered to be a method which is very suitable for the deposition of the film onto a plastic material having a low heat-resistance.

Figure 7:
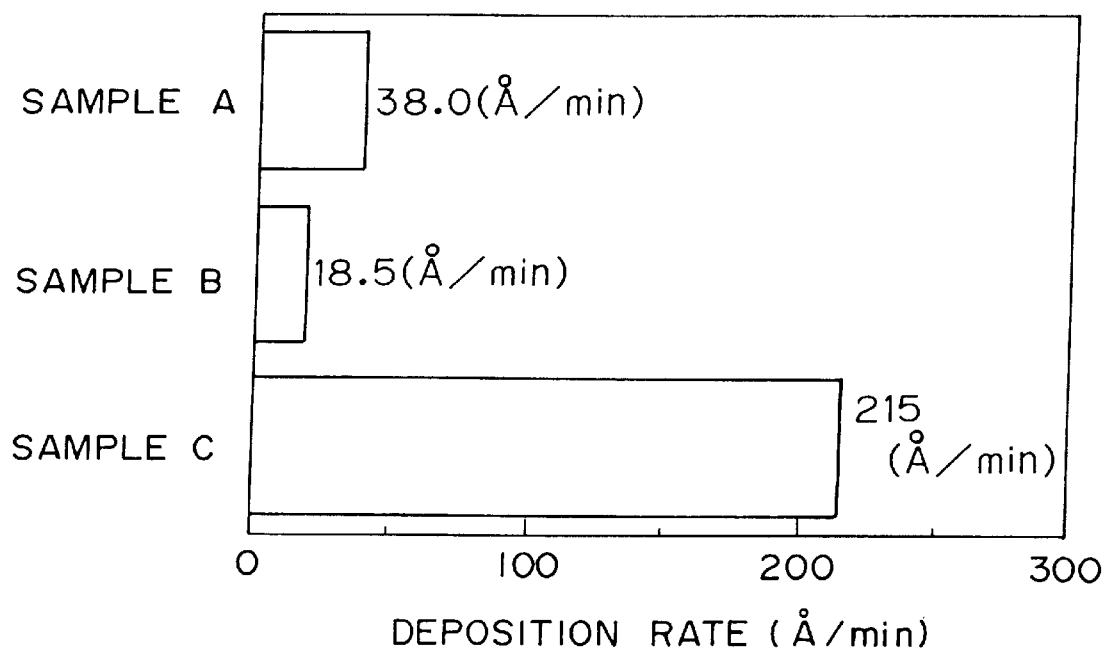
FIG. 7 shows a graph of the film deposition rates of the samples.

Selection of ECR plasma CVD conditions:

When a $SiO_2$ film is deposited on the surface of a plastic material, the surface of the substrate and the film being deposited are heated by the plasma and expand with respective heat expansion rates. After completion of the deposition, cracks are formed in the film due to the difference from the substrate in the rate of the shrinkage as the temperature is lowered. Since the heat expansion coefficient of a plastic material is higher when compared with other materials and the difference from $SiO_2$ in the heat expansion rate is large, the cracks are formed easily in the deposited film. In order to enhance the functions of a plastic material, plasma conditions in which an excellent $SiO_2$ film without cracks can efficiently be deposited should be selected. Table 1 shows the ECR plasma conditions when the films were deposited onto the selected plastic materials. Sample A contained a small amount of alkyl group, and obtained in the conditions in which a hard and excellent $SiO_2$ film deposition is possible. Sample B was subjected to the conditions to form a pliable film containing alkyl group to some extent for the purpose of suppressing the crack formation in the film deposited on the surface of the substrate. The TEOS flow rate was increased and the pressure was increased. In addition, the incident power of the plamsa was lowered and the increase in the temperature of the substrate and the film was suppressed. Such conditions were established based on the results of the preliminary experiment. Sample C was subjected to the conditions similar to those for Sample A except for placing the earthed mesh in the plasma. The deposition rates of these samples are shown in FIG. 7. The deposition rate of Sample C was extremely high due to the effect of the mesh. The chemical compositions of these samples determined by XPS are shown in Table 2. Sample C had an excellent $SiO_2$ film containing carbon in an amount as low as that in Sample A in spite of the high film deposition rate. Sample B exhibited the carbon content in the film as especially high as 15.4%.

TABLE 1

|  | Sample | | |
| --- | --- | --- | --- |
| Conditions | A | B | C |
| TEOS flow rate (sccm) | 1.5 | 2.0 | 1.5 |
| $O_2$ flow rate (sccm) | 10 | 10 | 10 |
| Pressure (Pa) | 0.7 | 2.0 | 0.7 |
| Microwave power (W) | 150 | 80 | 150 |
| Magnetic field (Gauss) | 875 | 875 | 875 |
| Substrate temperature | Room temp. | Room temp. | Room temp. |
| Mesh set up | X | X | O |

TABLE 2

|  | Atomic ratio (%) | | |
| --- | --- | --- | --- |
| Sample | Si | O | C |
| A | 28.8 | 69.1 | 2.1 |
| B | 24.7 | 59.9 | 15.4 |
| C | 29.1 | 69.6 | 1.3 |

Figure 8:
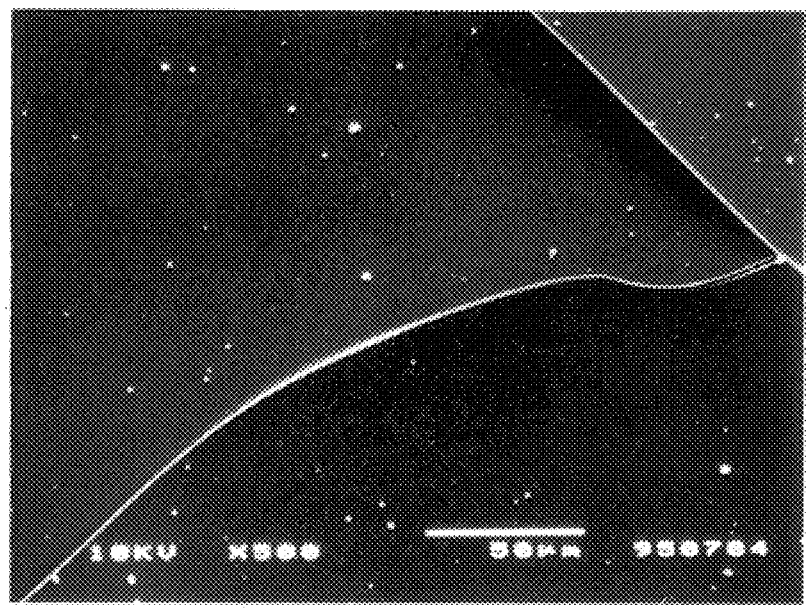
FIG. 8 shows a Scanning Electron Microscopy photo exhibiting the state of the film of Sample A deposited on polycarbonate in the examples.
Figure 9:
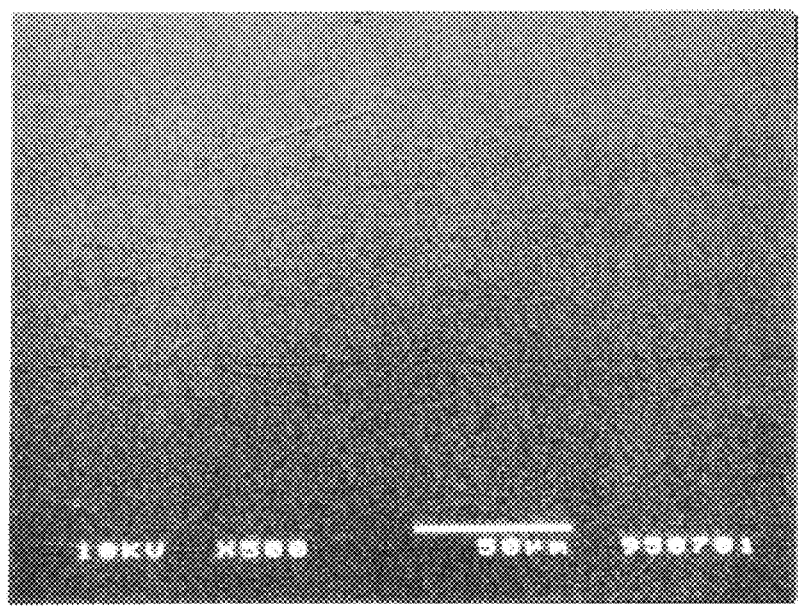
FIG. 9 shows a SEM photo exhibiting the state of the film of Sample B deposited on PC in the examples.
Figure 10:
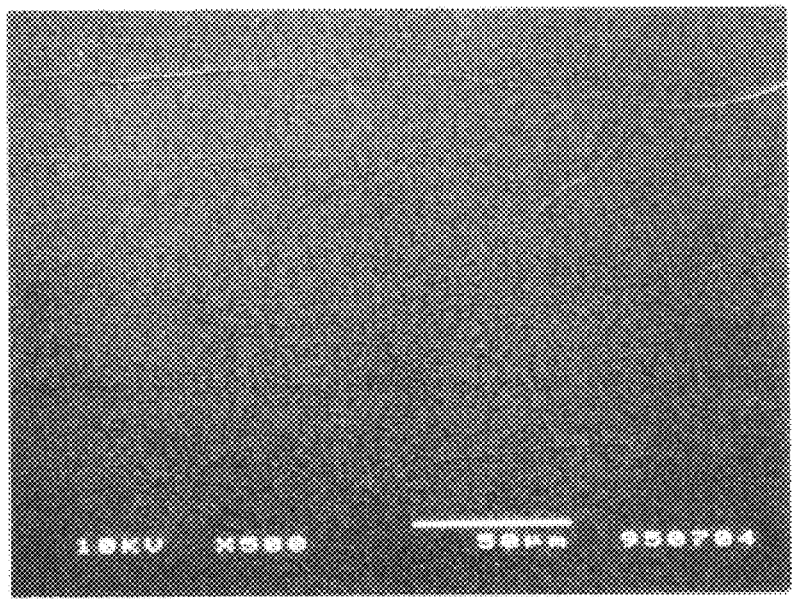
FIG. 10 shows a SEM photo exhibiting the state of the film of Sample C deposited on PC in the examples.
Figure 11:
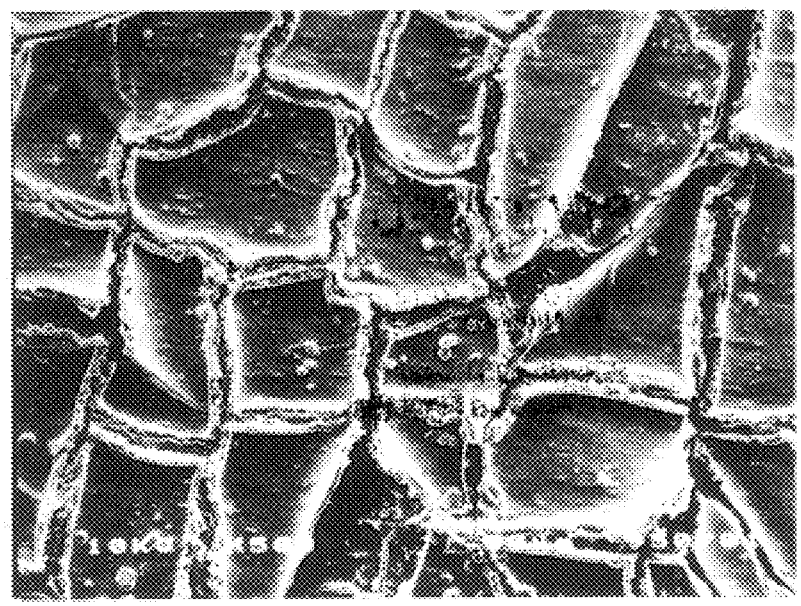
FIG. 11 shows a SEM photo exhibiting the state of the film of Sample A deposited on polypropylene in the examples.
Figure 12:
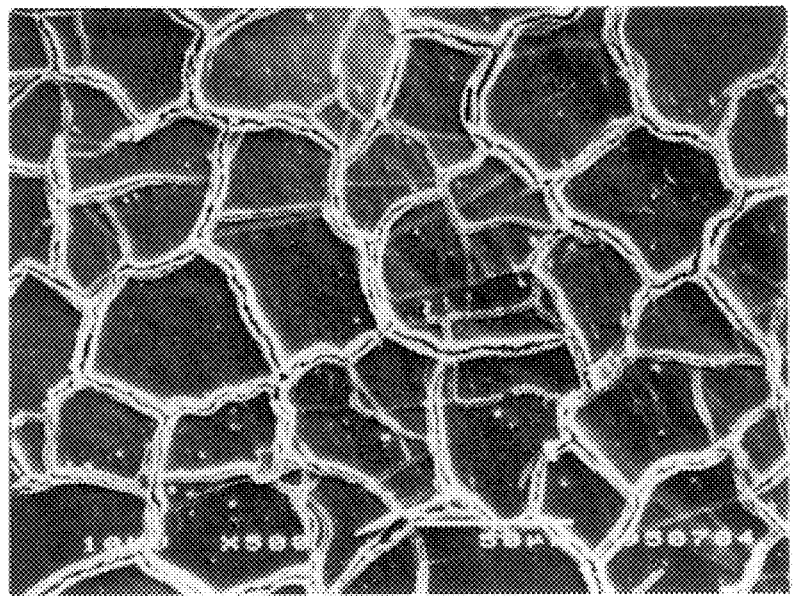
FIG. 12 shows a SEM photo exhibiting the state of the film of Sample B deposited on PP in the examples.
Figure 13:
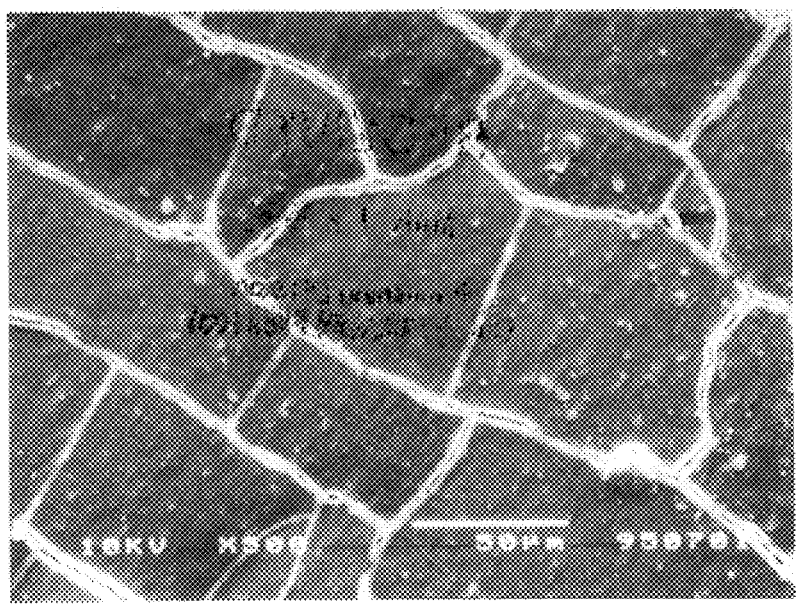
FIG. 13 shows a SEM photo exhibiting the state of the film of Sample C deposited on PP in the examples.

Microscopic observation of deposited $SiO_2$ film and determination of hardness:

The surfaces of PC and PP on which $SiO_2$ film was deposited in the thickness of 1.0 μm were observed microscopically and examined for their hardness. The SEM photos of the film surfaces of Sample A, B and C in which PC was employed as the substrate are shown in FIGS. 8, 9 and 10, respectively. The SEM photos of the film surfaces of Sample A, B and C in which PP was employed as the substrate are also shown in FIGS. 11, 12 and 13, respectively. Sample A, on both of PC and PP, had the cracks in the film, which may be due to the low deposition rate which prolonged the exposure of the substrate to the plasma, resulting in a greater increase in the temperature. Sample B exhibited an even deposition on the surface of PC which was attributable to the pliable film. However, on the surface of PP, the cracks were formed in the film. This may be due to the lower heat conductivity of PP than PC which prolonged the time period required for the distribution of the heat from the plasma throughout the entire substrate, which caused the temperature of the surface of the PP substrate to be increased rapidly by the heat from the plasma. Sample C exhibited an even $SiO_2$ deposition on the PC surface. Also on the PP surface, the cracks were milder than those in Sample A and B. This may be due to the high deposition rate which allowed a shorter time period during which the substrate was subjected to the plasma whereby suppressing the increase in the temperature. In addition, the results of the analysis of AFM image of the PP surface indicated that the unevenness on the PP surface was smoothed by the film deposition.

Table 3 shows the dynamic hardness of the plastic surfaces before and after deposition of $SiO_2$. In Sample B having the pliable film containing alkyl group, there was almost no increase in the hardness of the surface of PC which is relatively hard. However, in Sample C having the excellent film containing no alkyl group, the hardness was increased by 50% based on the initial value. The surface of PP which is relatively soft among the plastic materials exhibited increase in the hardness due to the film deposition in spite of the cracks observed in the deposited films in Sample A and B. The difference in the hardness by substrate materials observed in spite of the same thickness of the deposited film on PC and PP may reflect the effects of the cracks in the film as well as the dependency on the basal material. In Sample A, no accurate hardness was obtained because of the great damage of the film by the cracks.

TABLE 3

| Substrate | Dynamic hardness (HD115°) | | |
|---|---|---|---|
| | Original surface | Sample B | Sample C |
| Polycarbonate | 33.6 | 34.3 | 53.5 |
| Polypropylene | 12.5 | 20.0 | 22.2 |

Relationship between the positions of the supply gas inlet in the form of a ring and the mesh:

The relationship between the positions of the mesh, the supply gas inlet in the form of a ring and the substrate (regardless of the materials such as plastics, metals, ceramics etc.) is essential for the low temperature high rate deposition of $SiO_2$ film. FIG. 14 shows that the satisfactory tendency was obtained when the distance from the mesh to the supply gas inlet in the form of a ring is preferably 50 mm or less.

Figure 15:
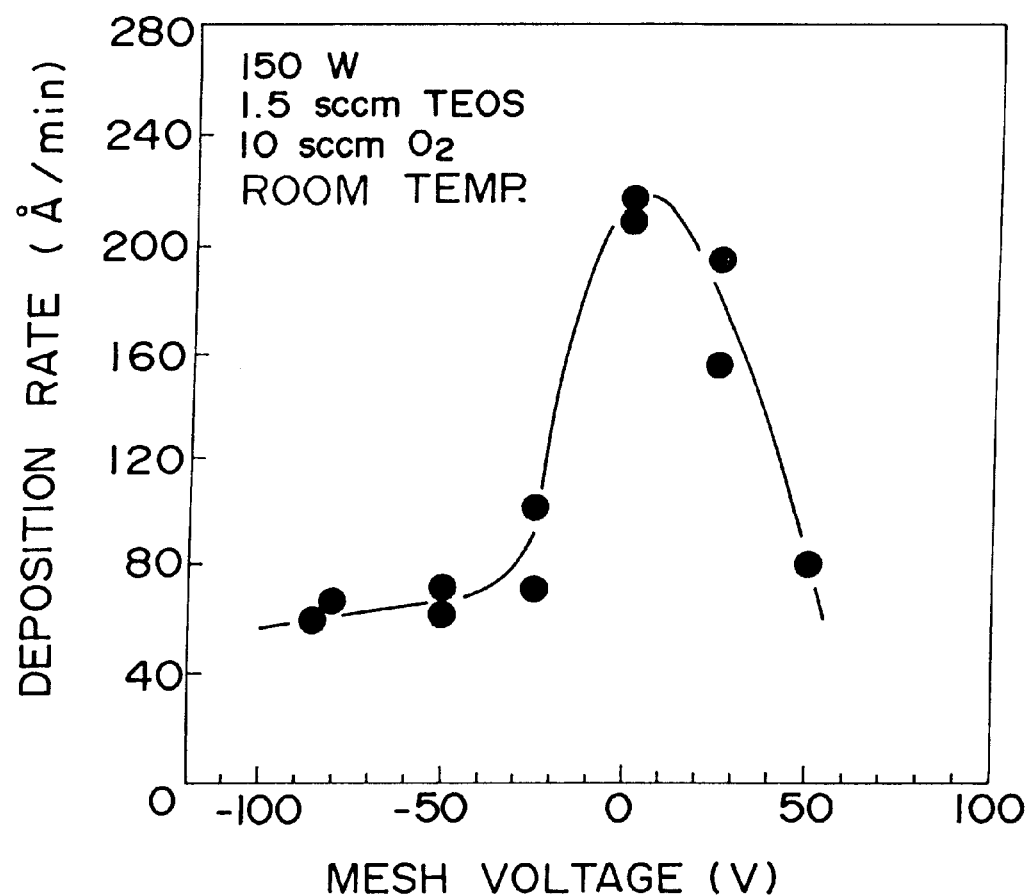
FIG. 15 shows the graph indicating the relationship between the applied voltage to the mesh and the film deposition rate.

Direct current voltage applied to mesh:

When the direct current voltage within the range from −50V to +50V is applied, the film deposition rate is increased. Especially, in the case of 0 V, i.e., in the case of mesh 14 being only earthed without applying the voltage, the electrons in the plasma can be trapped most effectively, and the film deposition rate is markedly increased. FIG. 15 shows that the most preferable result was obtained with the earthed mesh.

SUMMARY OF THE RESULTS

As understood from the results of the experiments described above, by placing the mesh in the plasma and trapping the electrons, the film deposition rate was markedly increased from 38 to 215 angstroms/min. Damage to the substrate and $SiO_2$ film by the heat from the plasma was also reduced due to the reduced time period of film deposition (FIG. 7), resulting in significant reduction in cracks in the film (FIGS. 8 to 13). The plasma conditions according to the present invention enable a quick coating of an excellent $SiO_2$ film (Table 2) on a plastic material without heating the substrate (FIG. 2, Table 1). The surface hardness of the plastic materials, namely, PC and PP, was increased remarkably (Table 3) by means of the coating of the excellent $SiO_2$ (FIGS. 4 and 5). The irregularity of the plastic surface were also smoothed by the film deposition.

ADVANTAGE OF THE INVENTION

As evident from the above description, according to the present invention, by utilizing ECR plasma CVD (Electron Cyclotron Resonance plasma Assisted Chemical Vapor Deposition) capable of a low temperature deposition of a high quality film, a transparent $SiO_2$ thin film can be deposited on the surface of a plastic material and improved surface hardness can be obtained without affecting the appearance. According to the present invention, the surface performance of the plastic materials can be improved dramatically, and the components which have been impossible to be made from plastic materials can be made from plastic materials on the practical basis, whereby providing recyclable and lighter weight automobile components.

The present invention can be applied to plastic components of various products including automobiles and motorcycles. For example, the present invention can be applied to automobile components such as transparent plastic lamp housings, meter panel plates, window components, sun roofs, pre-mounted plastic instrument panels, bumpers, door knobs, steering wheels, trimmings, console boxes, plastic mirror doors, mirrors, emblems, motorcycle components such as transparent plastic hoods, plastic cowlings, steering levers, fuel tanks and overboard machines such as plastic engine covers, as well as anti-corrosive coatings on metallic components.

What is claimed is:

1. A method of depositing a silicon oxide film on a polymer substrate by plasma Chemical Vapor Deposition comprising the steps:

applying a magnetic field to a plasma generating chamber by activating a magnetic coil positioned around the plasma generating chamber;

introducing an Electron Cyclotron Resonance plasma generating gas into the chamber;

introducing microwaves into the plasma generating chamber to thereby generate an Electron Cyclotron Resonance plasma;

feeding a supply gas comprising a silicon-containing compound from an inlet downstream of the plasma generating chamber and in fluid communication therewith;

providing the polymer substrate at a location downstream of the inlet;

passing the Electron Cyclotron Resonance plasma through a single earthed mesh positioned between the inlet and the polymer substrate or between the plasma generating chamber and the inlet; and contacting the polymer substrate with the Electron Cyclotron Resonance plasma passed through the mesh and the supply gas to thereby deposit a silicon oxide film on a surface of the polymer substrate.

2. The method according to claim 1 wherein said supply gas comprises tetraethoxysilane.

3. The method of claim 1 wherein said mesh comprises lattice interstice areas of 25 mm$^2$ or less.

4. The method of claim 1 wherein said ECR plasma generating gas is a gas selected from the group consisting of $O_2$, CO, $H_2$, He and Ar.

5. The method according to claim 1 wherein said step of introducing microwaves comprises introducing microwaves at between 100 W and 200 W.

6. The method of claim 1 wherein said inlet is in a form of a ring tube and has a plurality of holes for supplying said supply gas.

7. The method of claim 1, wherein the mesh is placed no greater than 50 mm from the inlet.

8. The method of claim 1, wherein the mesh is earthed with direct current voltage being 0 V.

* * * * *

UNITED STATES PATENT AND TRADEMARK OFFICE
CERTIFICATE OF CORRECTION

PATENT NO. : 5,962,083
DATED : October 5, 1999
INVENTOR(S) : Hatanaka et al.

It is certified that error appears in the above-identified patent and that said Letters Patent is hereby corrected as shown below:

Title page, [73] Assignee, "Suzuki Motor Corporation, Tokyo, Japan" should read --Suzuki Motor Corporation, Shizuoka-Ken, Japan--.

Title page, [56] References Cited, U.S. PATENT DOCUMENTS, insert the following:

| | | | |
|---|---|---|---|
| --5,468,520 | 11/1995 | Williams et al. | 427/575 |
| 4,560,577 | 12/1985 | Mirtich et al. | 427/533 |
| 5,175,020 | 12/1992 | Doellein et al. | 427/575 |
| 5,571,571 | 11/1996 | Musaka et al. | 427/575 |
| 5,492,734 | 2/1996 | Matsumoto et al. | 427/578 |
| 5,569,502 | 10/1996 | Koenuma et al. | 427/578--. |

Title page, [56] References Cited, OTHER PUBLICATIONS, insert the following:

--*Deposition of SiC Thin Films on Polymer Surface as a Hard Coating by ECR Plasma*, K. Sano et al., Technical Report, 1993, Vol. 93, pp. 86-91, Institute of Electronics and Communication Engineers of Japan--; lines 4 and 5, "Jidosha-Gitjutsukai" should read --Jidosha-Gijutsukai--; line 9, "Sen-i Gakkai" should read --Jidosha-Gijutsukai-; line 13, after "plasma(1).", insert --The lectures were given in Hamamatsu, Japan during October 25 to 26, 1995.

Signed and Sealed this

Third Day of April, 2001

*Attest:*

NICHOLAS P. GODICI

*Attesting Officer*     *Acting Director of the United States Patent and Trademark Office*